_United States Patent_ [19]

Murdoch

[11] 4,002,282
[45] Jan. 11, 1977

[54] INSULATION OF MICROCIRCUIT INTERCONNECTING WIRES

[75] Inventor: Francis J. Murdoch, Monmouth Beach, N.J.

[73] Assignee: The United States of America as represented by the Secretary of the Army, Washington, D.C.

[22] Filed: Mar. 25, 1976

[21] Appl. No.: 670,302

[52] U.S. Cl. ................................ 228/4.5; 228/18;
118/325; 118/401; 118/420; 425/110; 156/51; 156/51

[51] Int. Cl.² ...................................... H01L 21/60

[58] Field of Search ............. 228/4.5, 18; 118/401, 118/316, 325, 420; 156; 51; 427/117, 119, 120; 425/110

[56] References Cited
UNITED STATES PATENTS

| 867,658 | 10/1907 | Hoopes et al. | 427/117 X |
| 2,756,718 | 7/1956 | Stone et al. | 118/420 X |
| 3,222,149 | 12/1965 | Drummond | 156/51 X |
| 3,643,321 | 2/1972 | Field et al. | 228/4.5 |

_Primary Examiner_—Al Lawrence Smith
_Assistant Examiner_—K. J. Ramsey
_Attorney, Agent, or Firm_—Nathan Edelberg; Sheldon Kanars; Daniel Sharp

[57] ABSTRACT

A very-fine microcircuit interconnecting wire is passed through a central orifice in a capillary bonding head of a thermo-compression device which is used for pressing the balled end, or the body, of the microcircuit interconnecting wire to the metallized pads of a hybrid circuit chip. A pair of capillary tubes are moveably attached to the capillary bonding head in such a way that they can be positioned with their orifices opposing each other on opposite sides of the very fine wire just below the central orifice of the capillary bonding head. An insulating adhesive or enamel is passed through the capillary tubes to blend around the wire and form an insulating layer as the capillary bonding head is moved from one bonding point to the next.

9 Claims, 1 Drawing Figure

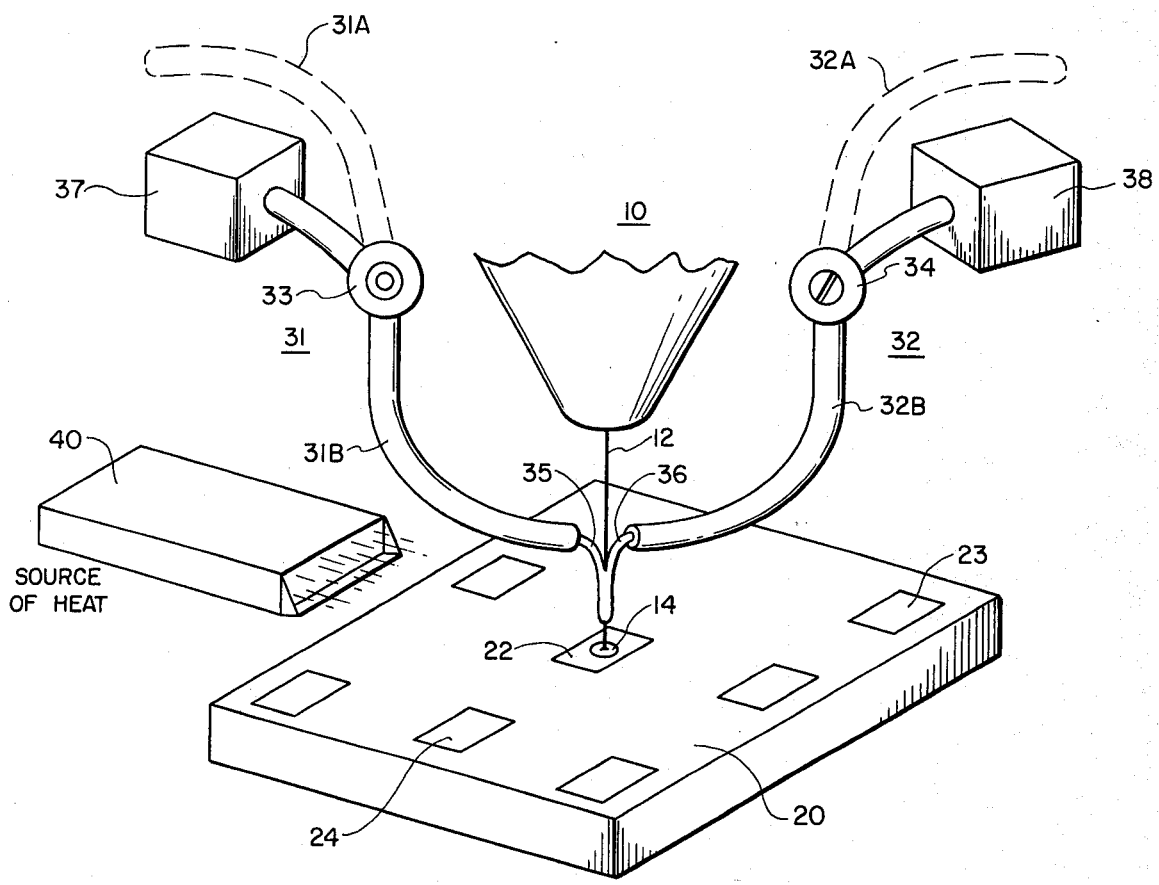

INSULATION OF MICROCIRCUIT INTERCONNECTING WIRES

The invention described herein may be manufactured, used or licensed by or for the Government for governmental purposes without the payment of any royalties thereon.

BACKGROUND OF THE INVENTION

There are many problems associated with the interconnection of elements in microcircuitry. The very dimensions of an integrated circuit or chip device in a hybrid circuit would have been unbelievable only a short time ago. Consequently, new techniques must be evolved to solve the many problems of their interconnection and to improve microcircuit technology.

One of the most difficult problems is the interconnection of various hybrid elements where the ultimate terminals of a micro-miniature circuit within a chip must be electrically and physically connected to the terminals of another microminiature circuit, of the same or another chip, or to a utilization circuit or device. With terminals measured in the thousands of an inch, and with wires a fraction of the size of a human hair, the problems are very difficult, and the chances of failure are relatively high. For one thing the wires are not, and almost cannot be, insulated. There would be no practical way of cleaning off the insulation to make a good contact, which is difficult enough without having to cope with insulation problems. And since the wires are not insulated, special care must be taken to avoid wires crossing each other, or even being positioned too close to each other.

This has led to the interconnection of hybrid circuits by means of a complicated fabrication technology. The first step being to generate the art work, e.g., make a rough drawing or lay-out of all the components and to arrange them in such a way that the shortest lines are used and there are a minimum number of crossovers. The design is then laid out accurately, using a computer graphic design system which generates a photo-mask that is used to make the actual substrate circuit, with metallized interconnecting lines.

This ultimately produces a complex network of interconnections, extending over very much more area than the chips themselves, just to come up with adjacent contact points. These networks of lines also add undesirable capacitance, inductance, and resistance to the overall circuit; besides the waste of space.

The hybrid elements or chips are mounted on the substrate in their proper positions with respect to the interconnecting lines and the bonds must be made from a metallized chip pad to a terminal at one end of a metallized line and then from a terminal at the other end of the lines to another metallized chip, pad or component terminal, and so on until all the components have been interconnected. This may require as many as three or four bonded interconnecting wires for one actual point-to-point contact.

There are other methods for insulating the interconnecting wires in the finished product; such as by evaporating insulation ;on the finished surface, or by encapsulating the entire substrate, but these must all be done after the wiring is completed, and short circuits in complex or close wiring may have occurred during the assembly process.

It is therefore an object of this invention to provide a system for insulating very-fine interconnecting wires as they are being connected from one terminal to the next so that wires can be corssed or placed in close proximity and hybrid elements can be directly interconnected without danger of shorting of the interconnecting wires. It is a further object of this invention to provide a system that can eliminate the complex networks of lines and multiple interconnections necessary in the existing systems. It is a further object of this invention to provide a system that permits side by side placement of hybrid elements to reduce the overall size of hybrid circuits.

SUMMARY OF THE INVENTION

A pair of capillary tubes are pivotably attached to the capillary bonding head of a thermocompression device for bonding microcircuit interconnecting wires to the metallized pads of a hybrid circuit. The pivoting attachment permits the capillary tubes to be held clear of the bonding head, the metallized pad, and the chip, while a bond is being made. Then, after the bonding head is withdrawn from the metallized pad, with the very-fine wire extending between the metallized pad and the head, the capillary tubes are pivoted so that their orifices oppose each other on opposite sides of the very-fine wire, just below the bonding head. An adhesive insulating material, in liquid form is then released through the capillary tubes to blend together around the very-fine wire as the bonder head is moved away from the last bond. This causes the very-fine wire to be coated and insulated while it is being drawn out of the capillary bonding head and moved toward the next metallized pad, whereat the flow of insulating material is stopped, the capillary tubes are withdrawn from the wire to their original position, and the next bond is made.

This makes it possible to have interconnecting wires cross over each other, or to be positioned adjacent to each other without the usual risk of shorting each other in manufacture, or while under the exceptional stresses that the finished product might be subjected to. This also makes possible the elimination of the complex, space-wasting interconnecting substrates that are presently used to avoid wire crossovers.

BRIEF DESCRIPTION OF THE DRAWING

The drawing shows an isometric view of a typical embodiment of this invention.

DESCRIPTION OF THE PREFERRED EMBODIMENT

Referring now to the drawing, a capillary bonding ehead 10 is shown with a wire 12 projecting from its orifice (not seen) to the bond 14, on the metallized pad 22 of the chip 20, which would normally be mounted on a larger substrate (which is omitted, because of scale factors, to simplify the presentation). Other metallized pads, such as 23 and 24 would also be on this or an adjacent chip for the bonding heads next electrical contact.

This drawing is of necessity on a greatly enlarged scale, since the chip 20 would be in the order of 0.050 inches and the metallized pads 22–24 would be a small fraction of that.

The capillary tubes 31 and 32, on opposing sides of the bonder head, are shown in withdrawn positions 31A and 32A, in dotted lines, and in operational positions 31B and 32B. The capillary tubes are attached to and may be controlled by the pivot points 33 and 34, through which the insulating liquid may be passed from typical storage containers 37 and 38 which will also include control valves and pressure control devices, if necessary, to force the liquid through the capillary tubes.

A source of heat is represented at 40 and may be desirable for accelerating the setting of the insulating material, as well as for bringing up the temperature of the metallized pads to the optimum temperature for thermocompression bonding.

In operation, the opposing streams of the adhesive, insulating liquid 35 and 36 from the capillary tubes 31B and 32B, respectively, on opposing sides of the wire 12, will blend together around the wire to form an insulation completely surrounding the wire, and, as the bonding head 10 is moved upward and toward the next metallized pad or terminal point, the streams of liquid will form a continuous layer of insulation along the wire.

Before the wire reaches its next contact point, or when sufficient wire has been drawn from the capillary bonding head to reach the next metallized pad or contact point, the flow of adhesive insulating liquid through the capillary tubes is stopped and the tubes are removed to the withdrawn positions 31A and 32A so that there will be an uninsulated portion of the very-fine wire adjacent to the head, and the bonding head 10 can press the bare wire onto the next terminal to form the electrical contact bond. When the bonding head is raised from this bond, the wire will presumably be cut by any well known means, and the bonding head can be moved to the first one of the next pair of terminals to be connected. The bonding head then presses the wire down on the terminal to make the next bond, and then is raised above that terminal, and the capillary tubes may be moved into the operating positions 31B and 32B to start the next section of insulation.

The adhesive insulating material may be any of several polymers or enamels that can pass through the minute wire. Some provision may be advisable to accelerate the hardening process of the insulation. Additional heat may be added in a well known manner from a radiant heat source, or from a hot air blower such as 40, although the substrate itself, which may already be heated to about 150° as part of the optimum bonding temperature requirements, may provide enough heat for drying or curing the insulation. It is assumed that some time interval will be involved, in any case, between the interconnecting steps.

Another method for heating a small area of a chip, or an interconnecting wire., is taught in my copending application for an "Electronic Fusion Wire Cutter for Microelectric Wire Bonders," Ser. No. 670,300, filed Mar. 25, 1976.

The adhesive insulating liquid may be supplied from any container or containers of well known types, represented by 37 and 38 that may be mounted on or adjacent to the mounting structure of the bonding head — which has been omitted for simplicity. Neither the containers nor the mounting structure, of whatever types chosen, would effect the functioning of the invention as taught.

Gravity may provide sufficient flow for the adhesive insulating liquids, or, if the material chosen is too viscous, or the capillary tube too small for adequate flow, pressure means of any well known type can be applied to the liquid or liquids in their respective containers to provide the necessary flow of liquid. Control valves would also be provided in conjunction with the containers or at any convenient point along the liquid conductors in a well known manner.

Capillary bonding heads are well known and are usually available as a part of a bonding unit that also includes mounting structure and controls for the bonding head as well as a work holder, the necessary microscope for observation, and temperature controls to insure optimum bonding conditions. Typical bonding units are available from Kulicke end Soffa Industries, Inc., of Horsham, Pa., for example. The very-fine interconnecting wires may be of aluminum, or any other highly-conductive metal, but are usually of gold, and generally less than 1 mil thick. The wires may be cut or severed by any effective method, but are usually severed by a flame technique that also balls the ends of the wire to provide an optimum metallic mass for bonding.

The wire may also be severed, and the portion of the substrate being bonded may also be heated by the "Electronic Fusion Wire Cutter for Microelectric Wire Bonders" described and claimed in my copending patent application.

The bonding may be by thermocompression where the substrate is heated to about 200° C and the wire — or the balled end of the wire — is mashed onto the metallized pad to form a connection. However, other bonding techniques are also applicable here. For example, an ultrasonic bonder using aluminum wire will work equally well.

While two capillary tubes are shown here, as a minimum for effective coating of the wire, it is obvious that three or more capillary tubes can be used, evenly spaced around the wire. This might provide a more uniform application of the insulating liquid. However the dual capillary system would be simpler and would be particularly suited for use with dual-chemical, self-hardening resins of the epoxy type.

While the ends of capillary tubes are shown positioned adjacent to the very-fine wire and opposing each other, it is obvious that the ends of the capillary tubes can be notched vertically to accommodate the very-fine wire and the outer edges of the capillary tubes can be butted together for a simpler and more positive spacing and to guide the wire and keep it in the center of the flow of insulating liquid.

It is to be understood that I do not desire to be limited to the exact details of construction shown and described, for obvious modifications will occur to a person skilled in the art.

What is claimed is:

1. A device, for insulating a wire issuing from an orifice, comprising:
   at least two capillary tubes pivotably mounted to the structure surrounding said orifice;
   means for moving said capillary tubes to a first position wherein the outlets of said capillary tubes oppose each other on opposite sides of said wire just below said orifice;
   at least one source of liquid, adhesive, insulating material;
   means for connecting the inputs of said capillary tubes to said source of liquid, adhesive, insulating material; and
   means for expressing said liquid, adhesive, insulating material from said capillary tubes to converge around said wire as it is drawn from aid orifice to provide an insulation along any desired length of said wire.

2. In combination with a devie for insulating a wire as in claim 1 at least one switching valve, associated with a corresponding one of said sources of liquid, adhesive, insulating material, for controlling the flow of said liquid, insulating material expressed from said capillary tubes.

3. In combination with a device for insulating a wire as in claim 1 means for applying heat to said liquid, adhesive, insulating material after it has been added to said wire.

4. A device for insulating a wire as in claim 1 wherein said means for expressing said liquid, adhesive, insulating material from said capillary tubes comprises means for applying pressure to said source of liquid, adhesive, insulating material to insure the flow of said liquid material from said outlets of said capillary tubes.

5. A device for insulating a wire as in claim 1 having a first source of liquid, insulating material connected to a first one of said capillary tubes and a second source of liquid, insulating material connected to a second one of said capillary tubes.

6. A device for insulating a wire as in claim 5 wherein said first source of liquid contains one part of a two-part self-curing epoxy resin and said second source of liquid contains the other part of said two-part self-curing epoxy resin.

7. A device for insulating a wire as in claim 1 wherein said orifice is the orifice of a capillary bonding head of a thermocompression bal bonder; said wire issuing from said orifice is the very-fine wire associated with the interconnection of the elements of a microelectronic circuit; and said structure surrounding said orifice is the mounting and controlling mechanism of said thermocompression ball bonder.

8. In combination with a device for insulating a wire as in claim 7 a hybrid microelectronic circuit having a plurality of metallized terminal pads; means for holding said hybrid micro-electronic circuit in position under said capillary bonding head; and means for moving said capillary tubes to a second position clear of said capillary bonding head, said microelectronic circuit, and the area between said capillary bonding head and said micro-electronic circuit, so that said capillary bonding head can function in its normal manner.

9. In a device for insulating a wire as in claim 8;
means for pressing said wire between said capillary bonding head and a first one of said metallized pads after said capillary tubes are moved to said second position;
means for withdrawing aid capillary bonding head from said first one of said metallized pads to draw said wire out of said orifice to extend between said orifice and said first one of said metallized pads; means for moving said capillary tubes back to said first position; means for moving said cappilary bonding head to a position above a second one of said metallized pads; and means for actuating a flow of said liquid, adhesive, insulating material through said capillary tubes to adhere to said wire and form a layer of insulation around the length of said wire that is drawn out of said orifice while said capillary bonding head is being moved to said second one of said metallized pads.

* * * * *